(12) United States Patent
Ito

(10) Patent No.: US 9,368,690 B2
(45) Date of Patent: Jun. 14, 2016

(54) SEMICONDUCTOR LIGHT-EMITTING DEVICE

(71) Applicant: Stanley Electric Co., Ltd., Tokyo (JP)

(72) Inventor: Kosaburo Ito, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/163,992

(22) Filed: Jan. 24, 2014

(65) Prior Publication Data

US 2014/0203306 A1   Jul. 24, 2014

(30) Foreign Application Priority Data

Jan. 24, 2013   (JP) .................................. 2013-010839

(51) Int. Cl.
| | | |
|---|---|---|
| *H01L 33/00* | (2010.01) | |
| *H01L 29/18* | (2006.01) | |
| *H01L 33/44* | (2010.01) | |
| *H01L 25/075* | (2006.01) | |
| *H01L 33/50* | (2010.01) | |
| *H01L 33/60* | (2010.01) | |

(52) U.S. Cl.
CPC .............. *H01L 33/44* (2013.01); *H01L 25/0753* (2013.01); *H01L 33/505* (2013.01); *H01L 33/60* (2013.01); *H01L 2224/16225* (2013.01)

(58) Field of Classification Search
CPC ...... H01L 33/50; H01L 25/0753; H01L 33/54
USPC ..................................................... 257/88, 98
See application file for complete search history.

(56) References Cited

U.S. PATENT DOCUMENTS 7,078,732 B1   7/2006   Reeh et al.
7,679,100 B2   3/2010   Schwenkschuster et al.
(Continued)

FOREIGN PATENT DOCUMENTS

EP   189 291 A2   3/2002
JP   11-340515 A   12/1999
(Continued)

OTHER PUBLICATIONS

Japanese Office Action for the related Japanese Patent Application No. 2010-173852 dated Jan. 8, 2014.
(Continued)

*Primary Examiner* — Moazzam Hossain
(74) *Attorney, Agent, or Firm* — Kenealy Vaidya LLP

(57) ABSTRACT

A semiconductor light-emitting device can include a wavelength converting layer including a surrounding portion, which covers at least one semiconductor light-emitting chip in order to emit various colored lights including white light. The semiconductor light-emitting device can include a substrate, a frame located on the substrate, the chip mounted on the substrate, a transparent material layer located on the wavelength converting layer so as to reduce from the wavelength converting layer toward a light-emitting surface thereof, and a reflective material layer disposed at least between the frame and both side surfaces of the wavelength converting layer and the transparent material layer. The semiconductor light-emitting device can be configured to improve light-emitting efficiency and a color variation by using the surrounding portion and an inclined side surface of transparent material layer, and therefore can emit various colored lights including white light having a high light-emitting efficiency from a small light-emitting surface.

20 Claims, 14 Drawing Sheets

(56) References Cited

U.S. PATENT DOCUMENTS

| | | | |
|---|---|---|---|
| 7,935,975 B2* | 5/2011 | Ishii et al. .................... 257/98 | |
| 8,251,560 B2 | 8/2012 | Ohno et al. | |
| 8,461,610 B2 | 6/2013 | Ito et al. | |
| 2006/0022211 A1 | 2/2006 | Yatsuda et al. | |
| 2007/0086148 A1 | 4/2007 | Schwenkschuster et al. | |
| 2007/0158674 A1* | 7/2007 | Taguchi et al. ............... 257/99 | |
| 2007/0257266 A1* | 11/2007 | Leatherdale et al. .......... 257/79 | |
| 2008/0054279 A1 | 3/2008 | Hussell et al. | |
| 2008/0054284 A1* | 3/2008 | Hussell ............... H01L 33/54 257/98 | |
| 2009/0001490 A1 | 1/2009 | Bogner et al. | |
| 2009/0039369 A1* | 2/2009 | Niino .................. H01L 33/54 257/98 | |
| 2009/0134417 A1 | 5/2009 | Sato et al. | |
| 2009/0159912 A1 | 6/2009 | Engl et al. | |
| 2009/0272985 A1* | 11/2009 | Ishii et al. ..................... 257/88 | |
| 2010/0264438 A1* | 10/2010 | Suenaga ............ H01L 33/58 257/98 | |
| 2011/0049550 A1* | 3/2011 | Katsuno ........... H01L 33/405 257/98 | |
| 2011/0180822 A1 | 7/2011 | Ruhnau et al. | |
| 2011/0235355 A1* | 9/2011 | Seko ........................ 362/510 | |
| 2011/0309388 A1* | 12/2011 | Ito et al. ...................... 257/89 | |
| 2012/0025218 A1 | 2/2012 | Ito et al. | |
| 2012/0299043 A1* | 11/2012 | Hsu ................... H01L 33/507 257/98 | |
| 2012/0305949 A1* | 12/2012 | Donofrio et al. ............. 257/88 | |
| 2012/0320617 A1 | 12/2012 | Ohno et al. | |
| 2013/0121009 A1* | 5/2013 | Tsutsumi et al. ........... 362/510 | |

FOREIGN PATENT DOCUMENTS

| | | |
|---|---|---|
| JP | 2004-31989 A | 1/2004 |
| JP | 2004-40099 A | 2/2004 |
| JP | 2006-37097 A | 2/2006 |
| JP | 2006-48934 A | 2/2006 |
| JP | 2007-103901 A | 4/2007 |
| JP | 2007-103937 A | 4/2007 |
| JP | 2008-47906 A | 2/2008 |
| JP | 2008-507850 A | 3/2008 |
| JP | 2008-103688 A | 5/2008 |
| JP | 2009-135136 A | 6/2009 |
| JP | 2009-526377 A | 7/2009 |
| JP | 2009-218274 A | 9/2009 |
| JP | 2010-118531 A | 5/2010 |
| JP | 2010-272847 A | 12/2010 |
| JP | 2013-38187 A | 2/2013 |
| WO | 2007/119782 A1 | 10/2007 |
| WO | 2007/146860 A1 | 12/2007 |
| WO | 2010/001306 A1 | 1/2010 |
| WO | 2010/017831 A1 | 2/2010 |

OTHER PUBLICATIONS

List of Potentially Related Pending U.S. Appl. No. 13/196,868 to Kosaburo ITO filed Aug. 2, 2011.

U.S. Appl. No. 13/196,868, filed Aug. 2, 2011, Kosaburo Ito et al.

* cited by examiner

SEMICONDUCTOR LIGHT-EMITTING DEVICE

This application claims the priority benefit under 35 U.S.C. §119 of Japanese Patent Application No. 2013-010839 filed on Jan. 24, 2013, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength converting layer, and more particularly, the disclosed subject matter relates to semiconductor light-emitting devices for a vehicle light and the like, which can emit various mixture lights having a high light-emitting efficiency and a substantially same color tone from a small light-emitting surface.

2. Description of the Related Art

Semiconductor light-emitting devices, in which a part of the light emitted from a semiconductor light-emitting chip is converted into light having a different wavelength by a phosphor and in which a mixture light comprises the light having the different wavelength mixed with the light emitted directly from the light-emitting chip is emitted, have been used as a light source for various lighting units. Such light-emitting devices have been also used as a light source for vehicle lamps such as a headlight for reasons of a battery friendly, lamp miniaturization, etc.

When the semiconductor light-emitting devices are used as a light source for a lighting unit such as a vehicle headlight, which controls light emitted from the light-emitting devices using a reflector and/or a projector lens, a light-emitting device having a small light-emitting surface may be desired to efficiently control light emitted from the light-emitting device with a small optical structure. Therefore, conventional semiconductor light-emitting devices including a wavelength material, which emit light have a white color tone from a small light-emitting surface, for example, are disclosed in Patent Document No. 1 (Japanese Patent Application Laid Open JP2010-272847).

FIG. 13 is an enlarged side cross-sectional view showing a conventional semiconductor light-emitting device having a small light-emitting surface, which is disclosed in Patent Document No. 1. The conventional semiconductor light-emitting device 1A includes: a base substrate 5 having a mounting surface, and a semiconductor light-emitting chip 2 having a top surface, a bottom surface and bottom electrodes located on the bottom surface, mounted on the mounting surface of the base substrate 5 via conductive members 6, each of the bottom electrodes electrically connected to a respective one of conductor patterns formed on the mounting surface of the base substrate 5 via a respective one of the conductive members 6.

In addition, the semiconductor light-emitting device 1A also includes: a transparent member 3 having a bottom surface 3a and a light-emitting surface 3b including a wavelength converting material, being disposed on the top surface of the semiconductor light-emitting chip 2 so as to be able to wavelength-convert light emitted from the semiconductor light-emitting chip 2, the bottom surface 3a thereof being larger than the top surface of the semiconductor light-emitting chip 2, and therefore a part of the bottom surface 3a contacting with the top surface of the semiconductor light-emitting chip 2, and the light-emitting surface 3b thereof being smaller than the bottom surface 3a; and a reflective resin layer 4 surrounding the transparent member 3 and the semiconductor light-emitting chip 2 to prevent the transparent member 3 from peeling from the semiconductor light-emitting chip 2, and being disposed between the mounting surface of the base substrate 5 and the bottom surface of the semiconductor light-emitting chip 2 so as to surround each of the conductive members 6.

Consequently, the conventional semiconductor light-emitting device 1A may emit a mixture light, in which a part of light emitted from the semiconductor light-emitting chip 2 is converted into light having a different wavelength by the wavelength converting material and the light having the different wavelength is mixed with the light emitted directly from the light-emitting chip 2, from the light-emitting surface that is smaller than the bottom surface 3a of the transparent member 3 including the wavelength converting material in terms of results.

However, the reflective resin layer 4 is also disposed underneath another part of the bottom surface 3a of the transparent member 3, which does not contact with the top surface of the semiconductor light-emitting chip 2, while contacting with a side surface of the semiconductor light-emitting chip 2. Accordingly, it may be difficult for the conventional semiconductor light-emitting device 1A to use not only the light emitted from the top surface of the semiconductor light-emitting chip 2, but also light emitted from the side surface of the semiconductor light-emitting chip 2 with high efficiency as the mixture light having a wavelength-converted wavelength, which is different from that the light emitted from the semiconductor light-emitting chip 2.

Therefore, Applicant of the disclosed subject matter discloses other conventional semiconductor light-emitting devices having a small light-emitting surface and a high light-emitting efficiency, which can use light emitted from a substantially whole light-emitting surface including a side surface of a semiconductor light-emitting chip, in Patent Document No. 2 (Japanese Patent Application Laid Open JP2013-038187) and in Patent Document No. 3 (U.S. Pat. No. 8,461,610), which are invented by the inventor of the presently disclosed subject matter and the like.

FIG. 14 is an enlarged side cross-sectional view showing another conventional semiconductor light-emitting device having a small light-emitting surface, which is disclosed in Patent Document No. 2 and No. 3. The other conventional semiconductor light-emitting device 1B includes: a base substrate 17 having a mounting surface and a peripheral potion; a frame 16 mounted on the peripheral potion of the base substrate 17; a semiconductor light-emitting chip 11 having bottom electrodes being mounted on the mounting surface of the base substrate 17 via metallic bumps 12, which electrically connects each of the bottom electrodes to a respective one of conductor patters via a respective one of the metallic bumps; and a wavelength converting layer 14 being slightly larger than a top surface of the semiconductor light-emitting chip 11, and being located over the top surface of the semiconductor light-emitting chip 11 to wavelength-converting light emitted from the semiconductor light-emitting chip 11.

In addition, the semiconductor light-emitting device 1B also includes: a transparent material layer 13 having a side surface 13S being disposed between a bottom surface of the wavelength converting layer 14 and the semiconductor light-emitting chip 11, and the side surface 13S extending from a substantially bottom end of the semiconductor light-emitting chip 11 toward a substantially bottom end of the transparent material layer 13; and a reflective material layer 15 disposed between an inner surface of the frame 16 and the wavelength converting layer 14 and the transparent material layer 13 and between the bottom surface of the semiconductor light-emitting chip 11 and the mounting surface of the base substrate 17 so as to surround each of the metallic bumps 12.

According to the conventional semiconductor light-emitting device 1B, light emitted from the semiconductor light-emitting chip 11 may widely direct toward the wavelength converting layer 14, and also light emitted from a side surface of the semiconductor light-emitting chip 11 may almost direct toward the wavelength converting layer finally by reflecting the light on the side surface 13S of the transparent material layer 13, because the side surface 13S contacts with reflective material layer 16 and is formed in a convex shape from the reflective material layer 16 toward the wavelength converting layer 14.

In addition, light directed from the semiconductor light-emitting chip 11 toward the mounting surface of the base substrate 17 may also be directed toward the wavelength converting layer 14 by using the bottom surface of the semiconductor light-emitting chip 11, which contacts with the metallic bumps 12 or the reflective material layer 16. Consequently, the conventional semiconductor light-emitting device 1B can enable most of light emitted from the light-emitting chip 11 to be directed toward the wavelength converting layer 14, and therefore can emit a mixture light having a high light-emitting efficiency from a small light-emitting surface, which is a top surface of the wavelength converting layer 14. However, the light-emitting surface of the light-emitting device 1B may be a substantially same shape as a top surface of the transparent material layer 13, and therefore may not be smaller than the top surface of the transparent material layer 13.

The above-referenced Patent Documents and an additional Patent Document are listed below and are hereby incorporated with their English specification and abstracts in their entireties.

1. Patent Document No. 1: Japanese Patent Application Laid Open JP2010-272847
2. Patent Document No. 2: Japanese Patent Application Laid Open JP2013-038187
3. Patent Document No. 3: U.S. Pat. No. 8,461,610 (ST3001-0307)
4. Patent Document No. 4: U.S. Patent Publication No. US 2012-0025218 (ST3001-0312)
5. Patent Document No. 5: U.S. Pat. No. 8,251,560 (ST3001-0242)
6. Patent Document No. 6: U.S. Patent Publication No. US 2012-0320617 (ST3001-0242CON)

The disclosed subject matter has been devised to consider the above and other problems, features, and characteristics. Thus, embodiments of the disclosed subject matter can include semiconductor light-emitting devices that can emit various mixture lights having a high light-emitting efficiency and a substantially uniform color tone from a small light-emitting surface. The disclosed subject matter can also include a semiconductor light-emitting device using a plurality of semiconductor light-emitting chips that can be used for wavelength-converting light having a very high light-emitting intensity with high light-emitting efficiency from a comparatively small light-emitting surface.

SUMMARY

The presently disclosed subject matter has been devised in view of the above and other problems, features, and characteristics. An aspect of the disclosed subject matter includes providing semiconductor light-emitting devices, which can emit various color lights having a high light-emitting intensity and a substantially uniform color tone with high efficiency from a small light-emitting surface.

According to an aspect of the disclosed subject matter, a semiconductor light-emitting device can include: a substrate having conductor patterns formed on a mounting surface thereof; a semiconductor light-emitting chip having at least one bottom chip electrode located on a bottom surface thereof, mounted on the mounting surface of the substrate via solder bumps, and the bottom chip electrode electrically connected to at least one of the conductor patterns of the substrate via at least one of the solder bumps; and a transparent material layer being formed in a tabular shape, located over a top surface of the semiconductor light-emitting chip, a bottom surface thereof being larger than the top surface of the semiconductor light-emitting chip.

In addition, the semiconductor light-emitting device can also include: a wavelength converting layer being disposed between a bottom surface of the transparent material layer and a side surface of the semiconductor light-emitting chip, contacting with the bottom surface of the transparent material layer and the side surface of the semiconductor light-emitting chip, and therefore including a surrounding portion to surround the side surface of the semiconductor light-emitting chip with the wavelength converting layer, and a side surface of the wavelength converting layer extending from the side surface of the semiconductor light-emitting chip toward the bottom surface of the transparent material layer; a frame located adjacent the mounting surface of the substrate, and surrounding the wavelength converting layer and the transparent material layer; and a reflective material layer disposed between the frame and the side surfaces of the wavelength converting layer and the transparent material layer and between the bottom surface of the semiconductor light-emitting chip and the mounting surface of the substrate while surrounding the solder bumps, wherein an area of the top surface of the transparent material layer is smaller than that of the top surface of the wavelength converting layer.

In the above-described exemplary semiconductor light-emitting device, the top surface of the reflective material layer can become higher from the frame toward the transparent material layer with reference to the mounting surface of the substrate. To form a smaller light-emitting surface (the top surface of the transparent material layer) than the top surface of the wavelength converting layer (the bottom surface of the transparent material layer), the side surface of the transparent material layer can be formed in a substantially inclined planar shape from the bottom surface toward the top surface of the transparent material layer, and also the side surface of the transparent material layer is composed of a first side surface and a second side surface extending in a direction substantially perpendicular to the bottom surface from the bottom surface of the transparent material layer, and the first side surface can connect between the second side surface and the top surface of the transparent material layer so as to incline from the second side surface toward the top surface of the transparent material layer. Additionally, the side surface of the transparent material layer can be formed in a concave shape toward the semiconductor light-emitting chip, and can also be formed in a convex shape toward the reflective material layer.

Moreover, in the above-described exemplary semiconductor light-emitting device, the side surface of the transparent material layer can be composed of a first side surface and a second side surface extending in a direction substantially perpendicular to the bottom surface of the transparent material layer from the top surface to the bottom surface of the transparent material layer, and the first side surface can connect the second side surface on the bottom surface of the transparent material layer so as to incline from the bottom surface to the top surface of the transparent material layer. In this case, each of the first side surface and the second side surface of the transparent material layer can include two surfaces facing with respect to each other, each of the two surfaces of the first side surface can connect between the two surfaces of the second side surface, and one of the two surfaces of the first surface can extend between the top surface and the bottom surface of the transparent material layer at a substantially right angle with respect to the bottom surface of the transparent material layer to easily form a clear cut-off line for a headlight.

According to the above-described exemplary semiconductor light-emitting device, the device can emit various mixture lights from the top surface of the transparent material layer that is slightly larger than the top surface of the semiconductor light-emitting chip while the surrounding portion of the wavelength converting layer can be used to also move light emitted the side surface of the light-emitting chip in a middle direction of the transparent material layer as a reflector that extends from the side surface of the semiconductor light-emitting chip toward the bottom surface of the transparent material layer. Thus, the disclosed subject matter can provide semiconductor light-emitting devices that can emit various mixture lights having a high light-emitting intensity and a substantially uniform color tone with high efficiency from a small light-emitting surface.

Another aspect of the disclosed subject matter includes the semiconductor light-emitting device that can include a plurality of semiconductor light-emitting chips with the above-described structures. In this case, the light-emitting device can emit the various mixture lights having a very high light-emitting intensity by using a large amount of lights emitted from the plurality of light-emitting chips. Thus, the disclosed subject matter can also provide semiconductor light-emitting devices using a plurality of semiconductor light-emitting chips that can be used for wavelength-converting light having a very high light-emitting intensity with high light-emitting efficiency from a comparatively small light-emitting surface.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
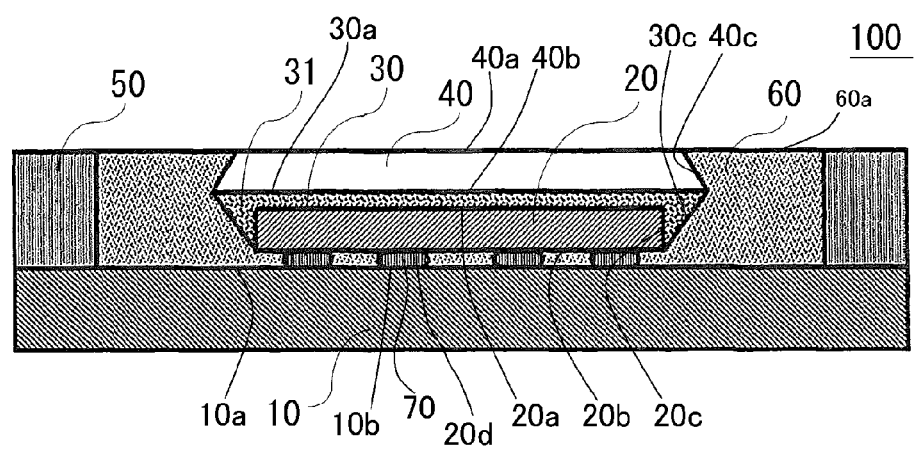
FIG. 1 is an enlarged side cross-sectional view showing a first exemplary embodiment of a semiconductor light-emitting device made in accordance with principles of the disclosed subject matter.
Figure 2:
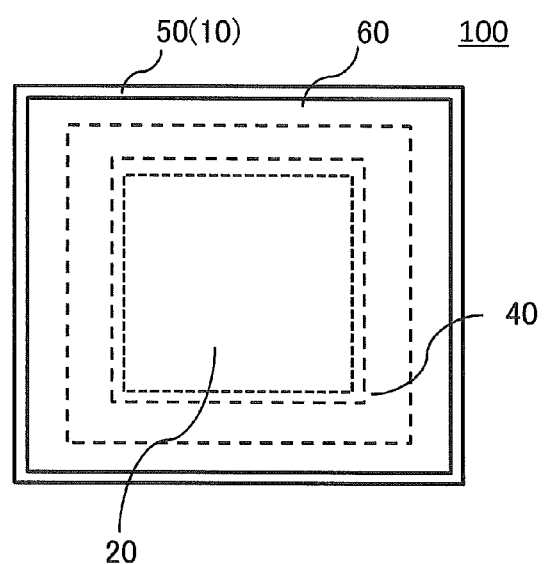
FIG. 2 is an enlarged top view showing the semiconductor light-emitting device of FIG. 1.

Exemplary embodiments of the disclosed subject matter will now be described in detail with reference to FIG. 1 to FIG. 12. FIG. 1 is an enlarged side cross-sectional view showing a first exemplary embodiment of a semiconductor light-emitting device made in accordance with principles of the disclosed subject matter, and FIG. 2 is an enlarged top view showing the semiconductor light-emitting device of FIG. 1.

The semiconductor light-emitting device 100 can include: a sub mount substrate 10 (hereinafter referred to as "substrate") having a mounting surface 10a and conductor patterns 10b formed on the mounting surface 10a; a semiconductor light-emitting chip 20 having a top surface 20a, a bottom surface 20b, a side surface 20c and at least one bottom chip electrode 20d located on the bottom surface 20b, and mounted on the mounting surface 10a of the substrate 10 via solder bumps 70 such as a gold bump, and the bottom chip electrode 20d electrically connected to at least one of the conductor patterns 10b of the substrate 10 via at least one of the solder bumps 70; and a transparent material layer 40 having a top surface 40a, a bottom surface 40b and a side surface 40c being formed in a tabular shape, located over the top surface 20a of the semiconductor light-emitting chip 20, and the bottom surface 40b thereof being slightly larger than the top surface 20a of the semiconductor light-emitting chip 20.

In addition, the semiconductor light-emitting device 100 can also include; a wavelength converting layer 30 having a top surface 30a and a side surface 30c disposed between the side surface 20c of the semiconductor light-emitting chip 20 and the bottom surface 40b of the transparent material layer 40 so as to extend from the side surface 20c of the semiconductor light-emitting chip 20 toward the bottom surface 40b of the transparent material layer 40, and therefore including a surrounding portion 31, which surround the side surface 20c of the semiconductor light-emitting chip 20 with the wavelength converting layer 30; a frame 50 located along an outer circumference of the mounting surface 10a of the substrate 10 so as to surround the wavelength converting layer 30 and the transparent material layer 40; and a reflective material layer 60 made of a material having a high reflectivity, disposed between the frame 50 and the side surfaces 30c and 40c of the wavelength converting layer 30 and the transparent material layer 40 and disposed between the bottom surface 20 of the semiconductor light-emitting chip 20 and the mounting surface 10a of the substrate 10 so as to fill a space between the solder bumps 12.

Here, the above-described elements of the semiconductor light-emitting device 100 will now be described. The substrate 10 can composed of a ceramic such as an Aluminum nitride (AlN) having a high thermal conductivity and the like, and the conductor patterns 10b can be made from Au (gold) and the like and formed on the mounting surface 10a of the substrate 10 to mount the semiconductor light-emitting chip 20 and to receive a power supply for the semiconductor light-emitting chip 20.

The frame 50 can be formed from the same material as the substrate 10, such as with aluminum nitride having a high thermal conductivity, ceramics, and the like, and can also be integrated into the substrate 10 as a one-body structure. The frame 50 can be attached on the outer circumference of the mounting surface 10a of the substrate 10 via an adhesive material and the like so as to surround the transparent material layer 40 and the wavelength converting layer 30, which is located between the semiconductor light-emitting chip 20 and the transparent material layer 40. The frame 50 can operate as a casing to dispose the reflective material layer 60, although the frame 50 may be removed from the substrate 10 by forming the reflective material layer 60 using a molding tool, etc.

The semiconductor light-emitting chip 20 can be mounted on the conductor patterns 10b of the mounting surface 10a of the substrate 10 with a flip-chip structure, which emits light from the top surface 20a and the side surface 20c. For example, when the semiconductor light-emitting 20 has a plurality of electrodes that are coplanar with the bottom surface 20b thereof, each of the electrodes of the light-emitting chip 20 can be electrically connected to a respective one of the conductor patterns 10b of the mounting surface 10a of the substrate 10 via a respective one of the solder bumps 70 so as to be able to provide the semiconductor light-emitting chip 20 with a power supply.

The semiconductor light-emitting chip 20 can be blue LED chips having a peak wavelength of approximately 460 nanometers, and also be a laser diode emitting blue light. The semiconductor light-emitting chip 20 can be an LED of InGaN series, which emits near-ultraviolet light having a wavelength of approximately 380 nanometers, and also can be a laser diode that emits ultraviolet light.

The wavelength converting layer 30 can include a phosphor to convert light emitted from the semiconductor light chip 20 into a particular wavelength or range of wavelengths of light. Accordingly, because the phosphor can be excited by the light emitted from the semiconductor light-emitting chip 20, and can emit a wavelength-converted light, the semiconductor light-emitting device 100 can emit a mixture light having a different wavelength from that of the semiconductor light-emitting chip 20 by an additive color mixture of a part of the light emitted from the semiconductor light-emitting chip 20 and the wavelength-converted light excited by another part of the light.

The wavelength converting layer 30 can include a resin layer that is made by mixing at least one phosphor with a transparent resin such as a silicone resin, en epoxy resin, an inorganic binder and the like and by solidifying said mixture resin including the phosphor. The wavelength converting layer 30 can cover the top surface 20, the side surface 20c and a part of the bottom surface 20b of the semiconductor light-emitting chip 20. The wavelength converting layer 30 can include a spacer such as a glass particle, a resin particle and the like to form the wavelength converting layer 30 having a substantially uniform thickness between the top surface 20a of the semiconductor light-emitting chip 20 and the bottom surface 40b of the transparent material layer 40, which is disclosed in Patent Document No. 4 by the inventor of this disclosed subject matter and the like.

When the semiconductor light-emitting chip 20 is a blue LED chip emitting blue light, and when the phosphor is a yellow phosphor emitting a yellow light upon being excited by the blue light emitted from the blue LED chip, the semiconductor light-emitting device 100 can emit substantially white light by an additive color mixture of the excited yellow light emitted from the yellow phosphor and a part of the blue light emitted from the blue LED chip. The yellow phosphor can include, $Y_3Al_5O_{12}$: $Ce^{3+}$(YAG), $Ca_x$ (Si, Al)$_{12}$ (O, N)$_{16}$: $Eu^{2+}$(SiAlON series phosphors), etc.

In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device 100 can also emit light having a substantially white color tone by an additive color mixture of the red-purple light emitted from the red phosphor that is excited by the blue light, the blue-green light emitted from the green phosphor that is excited by the blue light and a part of the blue light. The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like. $Y_3$(Ga, Al)$_5O_{12}$: $Ce^{3+}$, $Ca_3Sc_2Si_3O_{12}$: $Ce^{3+}$, $CaSc_2O_4$: $Eu^{2+}$, (Ba, Sr)$_2SiO_4$: $Eu^{2+}$, $Ba_3Si_6O_{12}N_2$: $Eu^{2+}$, (Si, Al)$_6$ (O, N): $Eu^{2+}$ and the like can be used as the green phosphor.

When the semiconductor light-emitting chip 20 is the laser diode emitting the ultraviolet light, the at least one phosphor can include: a red phosphor wavelength-converting the ultraviolet light into red light; a green phosphor wavelength-converting the ultraviolet light into green light; and a blue phosphor wavelength-converting the ultraviolet light into blue light so that the semiconductor light-emitting device 100 emits substantially white light.

As the red phosphor, $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like can be used. (Si, Al)$_6$ (O, N): $Eu^{2+}$, $BaMgAl_{10}O_{17}$: $Eu^{2+}Mn^{2+}$, (Ba, Sr)$_2SiO_4$: $Eu^{2+}$ and the like can be used as the green phosphor. (Sr, Ca, Ba, Mg)$_{10}$(PO$_4$)$_6C_{12}$: $Eu^{2+}$, $BaMgAl_{10}O_{17}$: $Eu^{2+}$, LaAl (Si, Al)$_6$ (N, O)$_{10}$: $Ce^{3+}$ and the like can be used as the blue phosphor. Additionally, the semiconductor light-emitting device 100 can emit various colored lights by adjusting a ratio of the red phosphor, the green phosphor and the blue phosphor by the additive color mixture of the excited colored lights.

The wavelength converting layer 30 can be formed by disposed an uncured wavelength converting material on the top surface 20a of the semiconductor light-emitting chip 20 and by solidifying the uncured wavelength converting material after mounting the transparent material layer 40 on the uncured wavelength converting material. An amount of the phosphor, which is contained in the wavelength converting layer 30, can be appropriately determined in view of a thickness, a viscosity and the like of the wavelength converting layer 30 based upon a kind, a usage and the like of light-emitting device.

The bottom surface 40b of the transparent material layer 40 can be slightly larger than the top surface 20a of the semiconductor light-emitting chip 20, and the transparent material layer 40 can be located over the semiconductor light-emitting chip 20 so that the bottom surface 40b of the transparent material layer 40 can cover the top surface 20a of the semiconductor light-emitting chip 20. In other words, an outermost periphery of the semiconductor light-emitting chip 20 will be completely blocked from view by the transparent material layer 40 when the semiconductor light-emitting device 100 is viewed from a position on the main optical axis which extends normal to the top surface 20a of the semiconductor light-emitting chip 20.

The wavelength converting layer 30 can include the surrounding portion 31, which surround the side surface 20c of the semiconductor light-emitting chip 20 with the wavelength converting layer 30 as described above. When the wavelength converting layer 30 is formed by solidifying the uncured wavelength converting material, a larger amount of an uncured wavelength converting material than an amount of the uncured wavelength converting material, which corresponds to a product of an area of the top surface 20a of the semiconductor light-emitting chip 20 and a thickness of the uncured wavelength converting material disposed between the top surface 20a of the semiconductor light-emitting chip 20 and the bottom surface 40b of the transparent material layer 40, can be disposed on the top surface 20a of the semiconductor light-emitting chip 20.

In this case, a surrounding portion of the uncured wavelength converting material can be formed in the uncured wavelength converting material by mounting the transparent material layer 40 on the uncured wavelength converting material and by covering the side surface 20c of the semiconductor light-emitting chip 20 with a surplus of the uncured wavelength converting material, which overflows from the top surface 20a of the semiconductor light-emitting chip 20. The surround portion 31 can be formed in the wavelength converting layer 30 by solidifying the whole uncured wavelength converting material under a prescribed temperature.

In the above-described manufacturing process, the surrounding portion 31 having various inclined angles can be formed in the wavelength converting layer 30 by adjusting the surplus of the uncured wavelength converting. The inclined angle of the surrounding portion 31 can be formed in 30 degrees to 80 degrees with respect to the normal direction of the top surface 20a of the semiconductor light-emitting chip 20, which is a same direction as the extending direction of the main optical axis of the semiconductor light-emitting device 100. The inclined angle of the surrounding portion 31 can be preferably formed in 30 degrees to 60 degrees with respect to the normal direction of the top surface 20a of the light-emitting chip 20.

The thickness of the wavelength converting layer 30 between the top surface 20a of the semiconductor light-emitting chip 20 and the bottom surface 40b of the transparent material layer 40 cannot be limited because the thickness of the wavelength converting layer 30 may vary in accordance with a thickness of the semiconductor light-emitting chip 20, the amount of the phosphor contained in the wavelength converting layer 30, etc. The thickness of the wavelength converting layer 30 can be formed within a range of 20 micrometers to 100 micrometers in general. For exemplary, when an LED chip having a thickness of 100 micrometers is used as the light-emitting chip 20, the thickness of the wavelength converting layer 30 may be approximately 20 micrometers to 60 micrometers.

The transparent material layer 40 can be formed in a tabular shape having the top surface 2a, which can be used as a light-emitting surface for the semiconductor light-emitting device 100, and therefore can be composed of a transparent material, which can emit the above-described mixture light. Specifically, as the transparent material, a transparent resin having a high thermal resistance such as a silicone resin, an epoxy resin and the like, and a glass having a high thermal resistance can be used.

The transparent material layer 40 can be configured with the transparent material having a same or similar refraction index (e.g., approximately from 1.4 to 1.8) as that of the wavelength converting layer 30. Thereby, a total reflection, which may occur on a boundary between the bottom surface 40b of the transparent material layer 40 and the wavelength converting layer 30, can be avoided. The transparent material layer 40 can be formed of one layer and also can be formed of a plurality of layers.

When the transparent material layer 40 is formed of the plurality of layers, for example, one of the layers can be formed of a semi-transparent layer so as to be able to transmit a light-emitting wavelength of the semiconductor light-emitting chip 20 and another light-emitting wavelength converted by the wavelength converting layer 30 by mixing a filler such as a wavelength converting material, a light-diffusing material, a light-scattering material and the like with the above-described transparent resin and an inorganic material such as a glass, etc.

In addition, the transparent material layer 40 can include at least one of an optical shape and a surface treatment on at least one of the top surface 40a and the bottom surface 40b. More specifically, although each of the top surface 40a and the bottom surface 40b is formed in a planar shape in FIG. 1, on at least one of the top surface 40a and the bottom surface 40b of the transparent material layer 40, an optical lens can be formed, and also a light-diffusing treatment such as a concave-convex shape and a light-emitting treatment such as a concave-convex lens, a diamond shape and the like can be formed. However, each area of the top surface 40a and the bottom surface 40b to be hereinafter described means an area in the case where is formed in a planar shape as shown in FIG. 1.

The transparent material layer 40 can include the side surface 40c, which is formed in an inclined shape so as to expand from the top surface 40a toward the bottom surface 40b of the transparent material layer 40, because the area of the top surface 40a is smaller than that of the bottom surface 40b, which contacts with the top surface 30a of the wavelength converting layer 30. Accordingly, the transparent material layer 40 can be formed in a substantially quadrangular truncated cone such that removes a top portion from the quadrangular pyramid in parallel with the bottom surface 40b.

Figure 3:
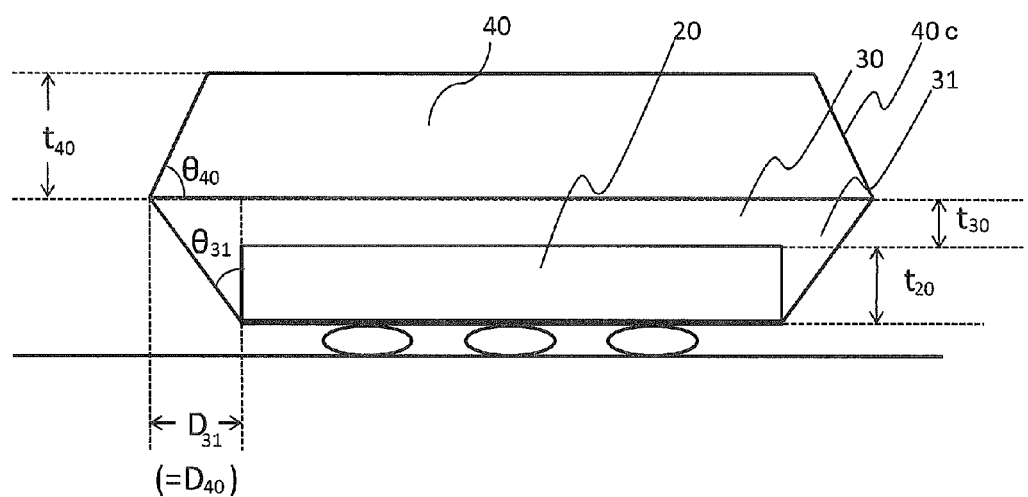
FIG. 3 is an explanatory cross-sectional view to explain principal sizes of a structure of the semiconductor light-emitting device shown in FIG. 1.

Each size of elements of the transparent material layer 40 will now be described in detail with reference to FIG. 3. A thickness $t_{40}$ between the top surface 40a and the bottom surface 40b of the transparent material layer 40 can be from 0.05 times to less than one time a thickness $t_{20}$ between the top surface 20a and the bottom surface 20b of the semiconductor light-emitting chip 20, and a maximum thickness $t_{40}$ of the transparent material layer 40 can be 1 millimeter or less. For example, when an LED chip having the thickness $t_{20}$ of 100 micrometers is used as the semiconductor light-emitting chip 20, the thickness $t_{40}$ of the transparent material layer 40 can be approximately 50 micrometers to 300 micrometers.

The bottom surface 40b of the transparent material layer 40 may be a substantially same area as that of the top surface 30a of the wavelength converting layer 30 because the transparent layer 40 is mounted on the uncured wavelength converting material and because the wavelength converting layer is formed by solidifying the uncured wavelength converting material under the prescribed temperature, as described above.

With respect to the surrounding portion 31 of the wavelength converting layer 30, a width $D_{31}$ of a top surface can be more than zero, and can be four or less times the thickness $t_{20}$ of the semiconductor light-emitting chip 20. Accordingly, a width $D_{40}$ of a projecting part of the transparent material layer 40 from the side surface 20c of the semiconductor light-emitting chip 20 can be approximately zero to four times the thickness $t_{20}$ of the side surface 20c of the semiconductor light-emitting chip 20. When the LED chip having a thickness of 100 micrometers is used as the semiconductor light-emitting chip 20, the width $D_{40}$ of the projecting part of the transparent material layer 40 from the side surface 20c of the semiconductor light-emitting chip 20 can be approximately zero to 400 micrometers.

Provided the inclined angle $\theta_{31}$ of the surrounding portion 31 is 45 degrees, when the inclined angle $\theta_{31}$ is approximated by a triangle, the width $D_{40}$ of the projecting part of the transparent material layer 40 can add the thickness $t_{20}$ of the semiconductor light-emitting chip 20 to the thickness $t_{30}$ of the wavelength converting layer 30 between the top surface 20a of the semiconductor light-emitting chip 20 and the bottom surface 40b of the transparent material layer 40.

An area of the top surface 40a of the transparent material layer 40 can be determined by the thickness $t_{40}$ of the transparent material 40 and an inclined angle $\theta_{40}$ of the side surface 40c. Although the thickness $t_{40}$ of the transparent material 40 is described above, the inclined angle $\theta_{40}$ of the side surface 40c can be 30 degrees to 85 degrees with respect to the bottom surface 40b of the transparent material layer 40 in substantially parallel with the top surface 20a of the semiconductor light-emitting chip 20. Thereby, most of light entering from the surrounding portion 31 into the transparent material layer 40 can be mixed with a direct light emitted from the top surface 2a of the semiconductor light-emitting chip 20 and another light wavelength-converted in the wavelength converting layer 30, while a certain amount of the light entering into the transparent material layer 40 can be reflected on a boundary between the side surface 40c of the transparent material layer 40 and the reflective material layer 60.

Therefore, among lights emitted from the top surface 40a of the transparent material layer 40, which is used as a light-emitting surface of the device 100, light expanding in an outward direction of the semiconductor light-emitting device 100 can reduce, and focused light can be emitted from the light-emitting surface of the semiconductor light-emitting device 100. In addition, among lights entering from the wavelength converting layer 30 into the transparent material layer 40 by forming the inclined angle $\theta_{40}$ of the side surface 40c at 30 degrees to 85 degrees with respect to the bottom surface 40b of the transparent material layer 40, after the certain amount of the light emitted from the surrounding portion 31 can be reflected on the boundary between the side surface 40c of the transparent material layer 40 and the reflective material layer 60, an amount of the light can be directed in a middle direction of the semiconductor light-emitting chip 20.

A part of said light, which is directed in the middle direction of the semiconductor light-emitting chip 20, may be reflected on the boundary between the transparent material layer 40 and the wavelength converting layer 30. Another part of the light may be reflected by the phosphor and the like contained in the wavelength converting layer 30 and by a boundary between the wavelength converting layer 30 and the semiconductor light-emitting chip 20. After that, the above reflected lights can be mixed with a mixture light emitted from the wavelength converting layer 30, and can be emitted from the top surface 40a of the transparent material layer 40 along with the mixture light described above. Therefore, the semiconductor light-emitting device 100 can emit the mixture light having a high light-emitting intensity and a high efficiency from the light-emitting surface thereof while promoting effective use of the light emitted from the side surface 20c of the semiconductor light-emitting chip 20.

The reflective material layer 60 can be made by dispersing a light-reflecting filler such as titanium oxide, zinc oxide, alumina and the like into a transparent resin such as a silicone resin. An amount of the light-reflecting filler contained in the reflective material layer 60 can be 20 weight percents to 90 weight percent with respect to the transparent resin so that the reflective material layer 60 can keep a prescribed reflectivity and diffusivity and an uncured reflective material can be easily disposed between the frame 50 and both side surfaces 30c and 40c of the wavelength converting layer 30 and the transparent material layer 40 so as to fill a apace between the bottom surface 20b of the semiconductor light-emitting chip 20 and the mounting surface 10a of the substrate 10.

A top surface 60a of the reflective material layer 60 can be formed between an end of the top surface 40a of the transparent material layer 40 and an inner end of a top surface of the frame 50. Consequently, the semiconductor light-emitting device 100 can be constructed so that the top surface 40a of the transparent material layer 40 can become the light-emitting surface, which is slightly larger than the top surface 20a of the semiconductor light-emitting chip 20 as shown in FIG. 1 to FIG. 3.

Methods for manufacturing the semiconductor light-emitting device 100 can be a substantially same as methods disclosed in Patent Document No. 4, and therefore will now be described simply. When the spacer is not used in the wavelength converting layer 30, a manufacturing process for disposing the space in the uncured wavelength converting material, which is disclosed in Patent Document No. 4, can be abbreviated.

As methods for forming the inclined side surface 40c of the transparent material layer 40, when the transparent material layer 40 is formed by a die cutting method, a transparent material plate can be cut to form the transparent material layer 40 by using a V-shaped cutting blade having a predetermined angle, and also can be cut by a cutting blade while varying a die cutting angle at a predetermined angle.

Figure 4:
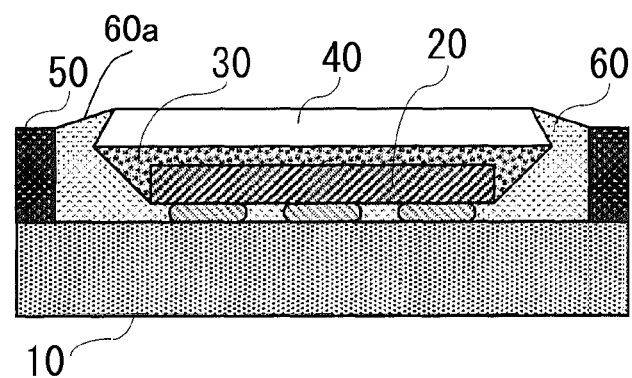
FIG. 4 is an enlarged cross-sectional view showing an exemplary variation of the semiconductor light-emitting device shown in FIG. 1.

In a process for forming the reflective material layer 60, the reflective material layer 60 can also be formed so that the top surface 40a of the transparent material layer 40 becomes higher than the top surface of the frame 50 with reference to the mounting surface 10a of the substrate 10 as shown in FIG. 4. In this case, the uncured reflective material can be disposed between the frame 50 and both side surfaces 30c and 40c of the wavelength converting layer 30 and the transparent material layer 40 so as to fill the space between the bottom surface 20b of the semiconductor light-emitting chip 20 and the mounting surface 10a of the substrate 10 using a surface tension thereof, and the reflective material layer 60 can be formed by solidifying the uncured reflective material under a prescribed temperature.

According to the semiconductor light-emitting device having the above-described structure, the transparent material layer 40 having the inclined side surface 40c in an inward direction thereof can be disposed on the wavelength converting layer 30 including the surrounding portion 31, which covers the semiconductor light-emitting chip 20 including the side surface 20c, and also the reflective material layer 60 can be disposed between the frame 50 and the both side surfaces 30c and 40c of the wavelength converting layer 30 and the transparent material layer 40 so as to fill the space between the bottom surface 20b of the semiconductor light-emitting chip 20 and the mounting surface 10a of the substrate 10.

Thereby, the most of light entering from the surrounding portion 31 into the transparent material layer 40 can be mixed with the direct light emitted from the top surface 20a of the semiconductor light-emitting chip 20 and the other light wavelength-converted in the wavelength converting layer 30, while the certain amount of the light entering into the transparent material layer 40 can be reflected on the boundary between the side surface 40c of the transparent material layer 40 and the reflective material layer 60. Accordingly, the semiconductor light-emitting device 100 can reduce the light expanding in the outward direction thereof, and can emit the focused light from the top surface 40a of the transparent material layer 40 while reducing a color variability, which may be caused among lights emitted from a portion over the surrounding portion 31 of the wavelength converting layer 30.

In addition, after the certain amount of the light emitted from the surrounding portion 31 can be reflected on the boundary between the side surface 40c of the transparent material layer 40 and the reflective material layer 60, the above reflected lights can be mixed with the mixture light emitted from the wavelength converting layer 30, and can be emitted from the top surface 40a of the transparent material layer 40 along with the mixture light described above. Thus, the semiconductor light-emitting device 100 can emit various colored lights having a high light-emitting intensity and a substantially uniform color tone from the small light-emitting surface thereof while effectively using the light emitted from the side surface 20c of the semiconductor light-emitting chip 20 with high efficiency.

Next, other exemplary embodiments of the transparent material layer 40 in regard to the semiconductor light-emitting device 100 will now be described with reference to FIG. 5 to FIG. 8. In these cases, because the above-described structure other than the transparent material layer 40 may be substantially same as the semiconductor light-emitting device 100 shown in FIGS. 1 and 2, the exemplary embodiments of the transparent layer 40, associated features and the like will be described.

Figure 5:
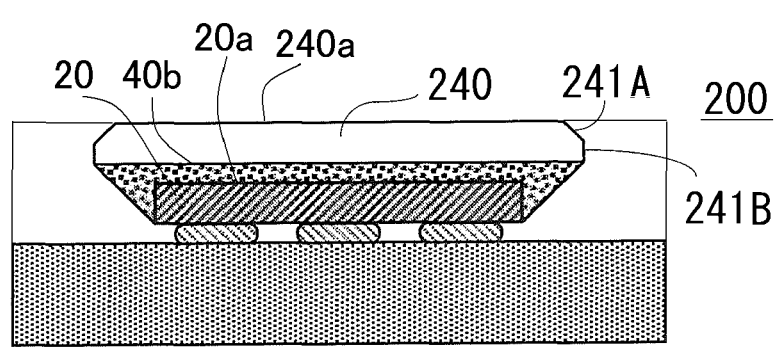
FIG. 5 is an enlarged cross-sectional view showing a second exemplary embodiment of a transparent material layer of the semiconductor light-emitting device shown in FIG. 1.

A second embodiment of the transparent material layer 40 can be formed in an inclined shape on a part of the side surface 40c of the transparent material layer 40. The semiconductor light-emitting device 200 can include a transparent material layer 240 having a first side surface 241A and a second side surface 241B, which extends in a direction substantially perpendicular to the bottom surface 40b from the bottom surface 40b of the transparent material layer 240 as shown in FIG. 5. The first side surface 241A can be connected between the top surface 240a and the second side surface 240B, and can incline in an inward direction of the transparent material layer 240 from the second side surface 241B at a prescribed angle. A ratio of heights of the first side surface 241A and the second side surface 241B in a direction perpendicular to the bottom surface 40b can be approximately 4:1 to 1:4.

An inclined angle of the first side surface 241A can be less than 90 degrees with respect to the bottom surface 40b of the transparent material layer 240, and can reduce until the top surface 240a of the transparent material layer 240, which is formed in a substantially planar shape, overlaps the top surface 20a of the semiconductor light-emitting chip 20 so as to become a substantially same area as the top surface 20a of the semiconductor light-emitting chip 20. Thereby, the top surface 240a, which is a light-emitting surface of the device 200, can be easily smaller than the top surface 40a of the semiconductor light-emitting surface 100 shown in FIG. 1, so that an end of the bottom surface 40b of the transparent material layer 240 does not break in a manufacturing process of the transparent material layer 240.

Figure 6:
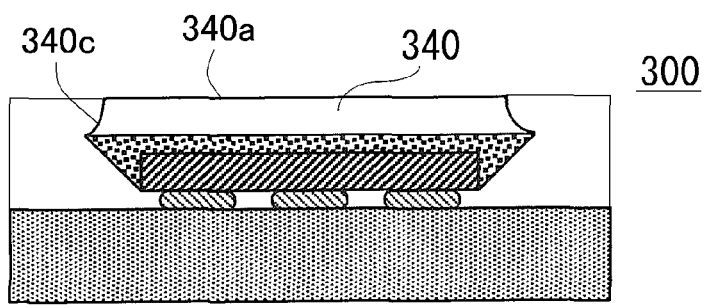
FIG. 6 is an enlarged cross-sectional view showing a third exemplary embodiment of the transparent material layer of the semiconductor light-emitting device shown in FIG. 1.

A third embodiment of the transparent material layer 40 of the semiconductor light-emitting device 100 can be formed in a concave shape on at least the part of the side surface 40c of the transparent material layer 40. The semiconductor light-emitting device 300 can include a transparent material layer 340 having a top surface 340a and a side surface 340c, which is formed in a concave shape in a direction toward the top surface 340a, which becomes a light-emitting surface of the semiconductor light-emitting device 300 as shown in FIG. 6.

Figure 7:
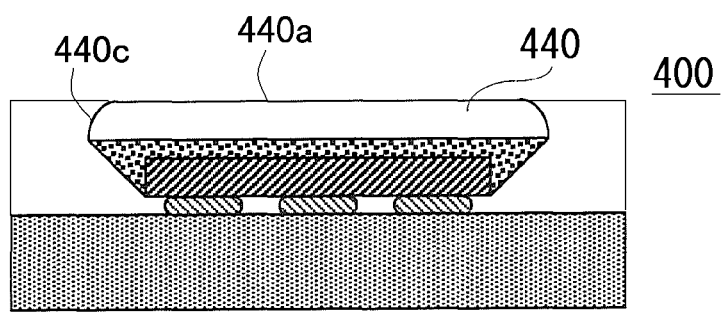
FIG. 7 is an enlarged cross-sectional view showing a fourth exemplary embodiment of the transparent material layer of the semiconductor light-emitting device shown in FIG. 1.

A fourth embodiment of the transparent material layer 40 of the semiconductor light-emitting device 100 can be formed in a convex shape on at least the part of the side surface 40c of the transparent material layer 40. The semiconductor light-emitting device 400 can include a transparent material layer 440 having a top surface 440a and a side surface 440c, which is formed in a convex shape in an opposite direction of the top surface 440a, which is a light-emitting surface of the semiconductor light-emitting device 400 as shown in FIG. 7.

Figure 8:
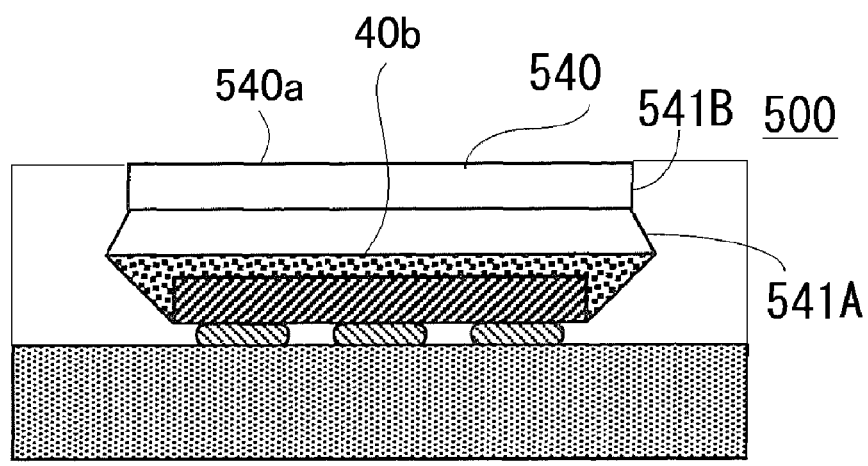
FIG. 8 is an enlarged cross-sectional view showing a fifth exemplary embodiment of the transparent material layer of the semiconductor light-emitting device shown in FIG. 1.

A fifth embodiment of the transparent material layer 40 can be formed in an inclined shape on the part of the side surface 40c of the transparent material layer 40 in common with the second embodiment. The semiconductor light-emitting device 500 can include a transparent material layer 540 having a first side surface 541A and a second side surface 541B, which extends in a direction substantially perpendicular to the bottom surface 40b from the bottom surface 40b of the transparent material layer 540 as shown in FIG. 8.

The first side surface 541A can be connected between the bottom surface 40b and the second side surface 541B, and can incline in an inward direction of the transparent material layer 540 from the bottom surface 40b at a prescribed angle. A ratio of heights of the first side surface 541A and the second side surface 541B in a direction perpendicular to the bottom surface 40b can be approximately 1:4 to 4:1. The inclined angle of the first side surface 541A can be 30 degrees to 85 degrees with respect to the bottom surface 40b of the transparent material layer 540 in substantially parallel with a top surface 540a, which becomes a light-emitting surface of the semiconductor light-emitting device 500.

In the above-described third, fourth and fifth embodiments, each of mixture lights emitted from the surrounding portions 31 of the wavelength converting layers 30 can be directed in an inner direction of light-emitting devices 300, 400 and 500 because each of the top surfaces 340a, 440a and 540a can be smaller than the bottom surfaces 40b of the transparent material layers 340, 440 and 540, respectively. Thus, each of the semiconductor light-emitting devices 300, 400 and 500 can emit various colored lights having a high light-emitting intensity and a substantially uniform color tone from each of the small light-emitting surfaces thereof while effectively using the light emitted from the side surface 20c of the semiconductor light-emitting chip 20 with high efficiency, respectively.

As methods for forming each of the side surfaces of the transparent material layers 240, 340, 440 and 540 in the above-described embodiments, when each of the transparent material layers is formed by a die cutting method, a transparent material plate can be cut to form each of the transparent material layers by using a cutting blade having a predetermined angle, a cutting blade having a round shape, etc. Each of the transparent material layers 240, 340, 440 and 540 can also be made by two die cutting processes, for example, a first process to form an inclined surface and a second process to form a normal surface. Additionally, each of the transparent material layers 240, 340, 440 and 540 can also be made by laminating a plurality of transparent material plates each having a different shape of a side surface.

Figure 9:
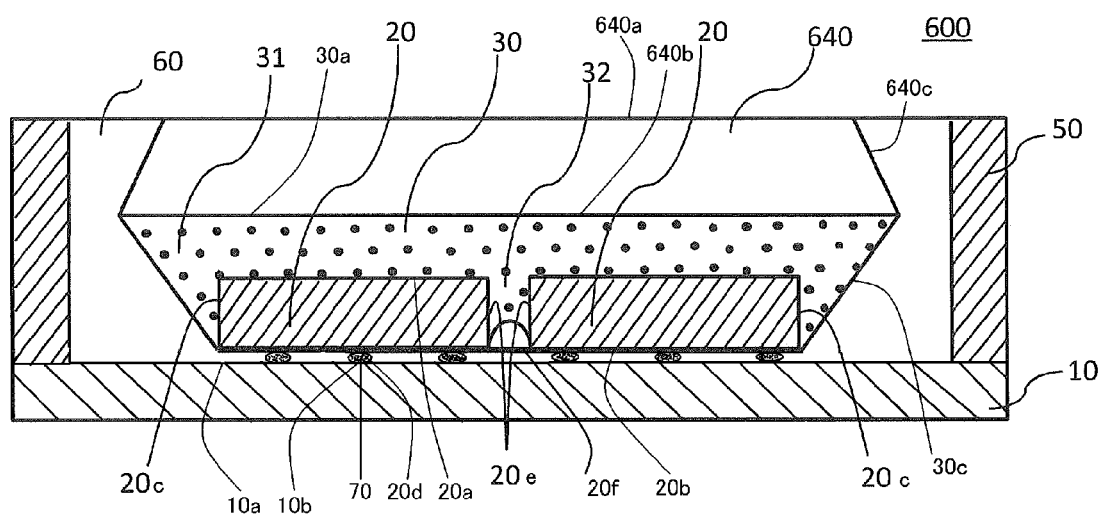
FIG. 9 is an enlarged side cross-sectional view showing a second exemplary embodiment of a semiconductor light-emitting device made in accordance with principles of the disclosed subject matter.

Second exemplary embodiments will now be described with reference to FIG. 9 to FIG. 12, in which same or similar elements as the first embodiment use same marks. The second embodiments can include a plurality of semiconductor light-emitting chips to emit various color lights having a higher light-emitting intensity than the first embodiment. FIG. 9 is an enlarged side cross-sectional view showing a second exemplary embodiment of a semiconductor light-emitting device made in accordance with principles of the disclosed subject matter.

The semiconductor light-emitting device 600 can include: the substrate 10; semiconductor light-emitting chips 20 each having a first side surface 20c and a second side surface 20e facing with respect to each other, mounted on a chip board 20f, and mounted on the mounting surface 10a of the substrate 10 via the solder bumps 70 along the chip board 20f; and a transparent material layer 640 having a top surface 640a, a bottom surface 640b and a side surface 640c located over the top surfaces 20a of the semiconductor light-emitting chips 20, and the bottom surface 640b thereof being slightly larger than the top surfaces 20a of the semiconductor light-emitting chips 20.

In addition, the semiconductor light-emitting device 600 can also include: the wavelength converting layer 30 disposed between the first side surfaces 20c and the second side surfaces 20e of the semiconductor light-emitting chips 20 and the bottom surface 640b of the transparent material layer 640 so as to extend from each of the first side surfaces 20c of the semiconductor light-emitting chips 20 toward the bottom surface 640b of the transparent material layer 640, and therefore including the surrounding portion 31, which surrounds the first side surfaces 20c of the semiconductor light-emitting chips 20 with the wavelength converting layer 30; the frame 50 located along the outer circumference of the mounting surface 10a of the substrate 10; and the reflective material layer 60 disposed between the frame 50 and the side surfaces 30c and 640c of the wavelength converting layer 30 and the transparent material layer 640 and disposed between at least one of the chip board 20f and the bottom surfaces 20b of the semiconductor light-emitting chips 20 and the mounting surface 10a of the substrate 10 so as to fill the space between the solder bumps 12.

Methods for manufacturing the semiconductor light-emitting device 600 can also be a substantially same as methods disclosed in Patent Document No. 4, and therefore will now be described simply. When the spacer is not used in the wavelength converting layer 30, a manufacturing process for disposing the space in the uncured wavelength converting material, which is disclosed in Patent Document No. 4, can be abbreviated. In a manufacturing process for forming the wavelength converting layer 30, the uncured wavelength converting material can be disposed on each of the top surfaces 20a of the semiconductor light-emitting chips 20, and the transparent material layer 640 can be mounted on the uncured wavelength converting material.

Then, the wavelength converting layer 30 including the surrounding portion 31 can be formed by solidifying the uncured wavelength converting material as shown in FIG. 9. In this case, the wavelength converting layer 30 can also be disposed in a spaced portion 32 between the adjacent second side surfaces 20e. An amount of the wavelength converting layer 30, which is disposed in the spaced portion 32, can be determined by adjusting the uncured wavelength converting material so as to reduce a color variation of light emitted from the top surface 640a of the transparent material layer 640.

Figure 10A:
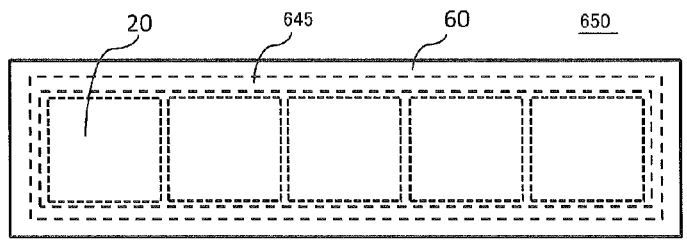
FIGS. 10a, 10b and 10c are enlarged top views showing a first exemplary variation, a second exemplary variation and a third exemplary variation of the semiconductor light-emitting device of FIG. 9, respectively.
Figure 10B:
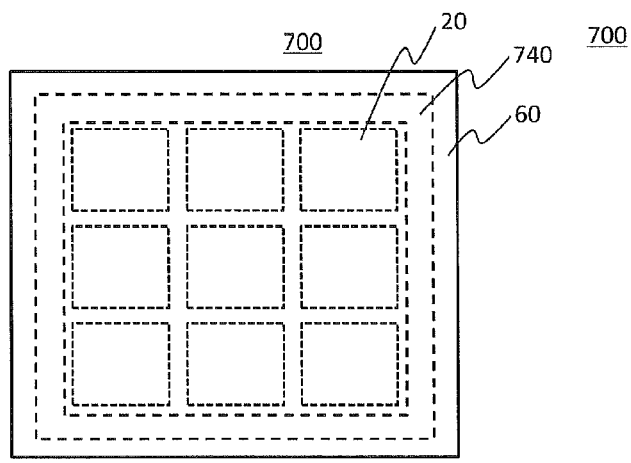
Figure 10C:
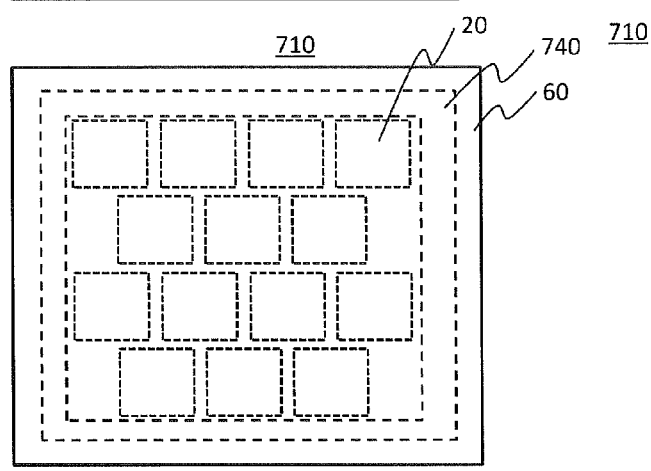

FIGS. 10a, 10b and 10c are enlarged top views showing a first exemplary variation, a second exemplary variation and a third exemplary variation of the second embodiment of the semiconductor light-emitting device shown in FIG. 9, respectively. The semiconductor light-emitting device 650 of the first variation can include a plurality of semiconductor light-emitting chips 20, which aligns in a substantially straight line, and a transparent material layer 650 located over the top surfaces 20a of the semiconductor light-emitting chips 20 so that a bottom surface of the transparent material layer 650 becomes slightly larger than the top surfaces 20a of the semiconductor light-emitting chips 20 as shown in FIG. 10a.

The semiconductor light-emitting device 700 of the second variation can include a plurality of semiconductor light-emitting chips 20, which is located in a two-dimensional matrix, and a transparent material layer 740 located over the top surfaces 20a of the semiconductor light-emitting chips 20 so that a bottom surface of the transparent material layer 740 becomes slightly larger than the top surfaces 20a of the semiconductor light-emitting chips 20 as shown in FIG. 10b.

The semiconductor light-emitting device 710 of the third variation can include a plurality of semiconductor light-emitting chips 20 composed of a first location and a second location, which align in a straight line and have a different phase with respect to each other, and which are alternately located in a direction substantially perpendicular to each of longitudinal directions of the first location and the second location of the light-emitting chips 20, and the transparent material layer 740 located over the top surfaces 20a of the semiconductor light-emitting chips 20 so that a bottom surface of the transparent material layer 740 becomes slightly larger than the top surfaces 20a of the semiconductor light-emitting chips 20 as shown in FIG. 10c.

In the above-described second embodiments, each of the transparent material layers 640, 645 and 740 can be replaced with each of the first, second, third, fourth and fifth embodiments of the transparent material layers as shown in FIGS. 3, 5, 6, 7 and 8, respectively. Each of intervals between the adjacent chips in the semiconductor light-emitting chips 20 cannot be limited because each of the intervals varies in accordance with a chip size, but each of the intervals can be approximately 50 micrometers to 400 micrometers in general.

In the above-described various combinational embodiments, each of mixture lights emitted from the surrounding portions 31 of the wavelength converting layers 30 can be directed in an inner direction of light-emitting devices 600, 650, 700 and 710, because each of the top surfaces 20a of the semiconductor light-emitting chips 20 can be smaller than each of the bottom surfaces of the transparent material layers in the light-emitting devices, respectively. Thus, each of the semiconductor light-emitting devices 600, 650, 700 and 710 can also emit various colored lights having a very high light-emitting intensity and a substantially uniform color tone from each of the light-emitting surfaces thereof while effectively using each of lights emitted from the side surfaces 20c of the semiconductor light-emitting chips 20 with high efficiency, respectively.

In addition, the semiconductor light-emitting devices of the second embodiments may cause a color variation due to each interval of the adjacent chips as compared with the first embodiments. Accordingly, on at least a part of at least one of the top surface and the bottom surface of the transparent material layer, a surface treatment such as a fine convex-concave shape can be formed to reduce the color variation.

Figure 11:
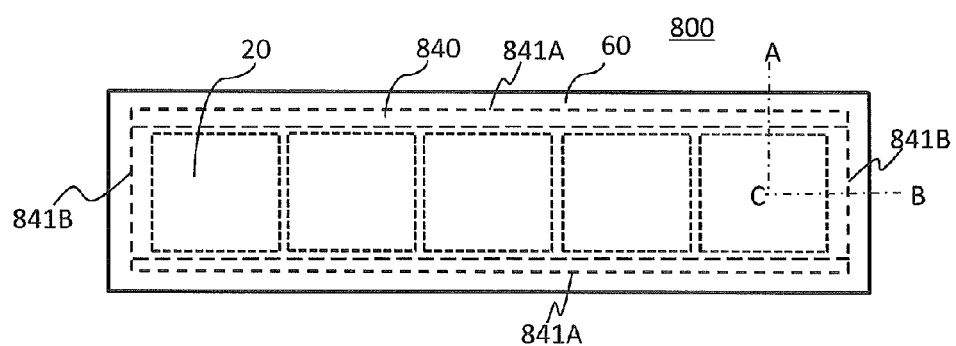
FIG. 11 is an enlarged top view showing an exemplary variation of the semiconductor light-emitting devices shown in FIG. 9 and FIG. 1.
Figure 12:
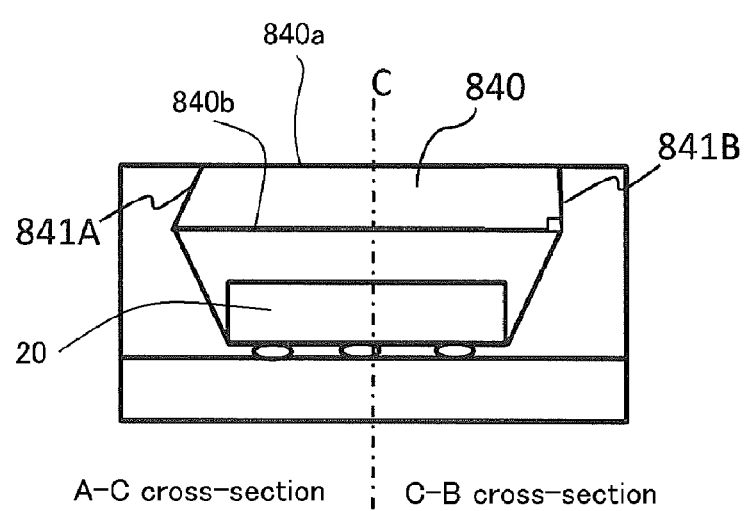
FIG. 12 is a cross-sectional view taken along lines AC and CB of the semiconductor light-emitting device shown in FIG. 11.
Figure 13:
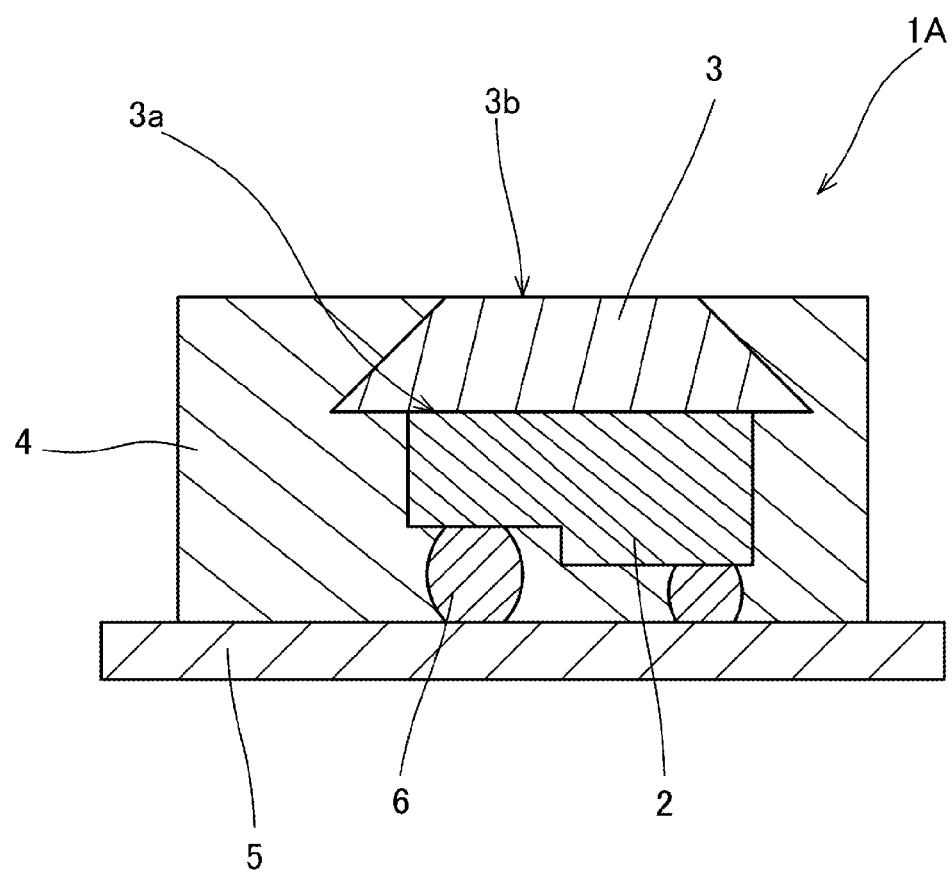
FIG. 13 is an enlarged side cross-sectional view showing a conventional semiconductor light-emitting device having a small light-emitting surface.
Figure 14:
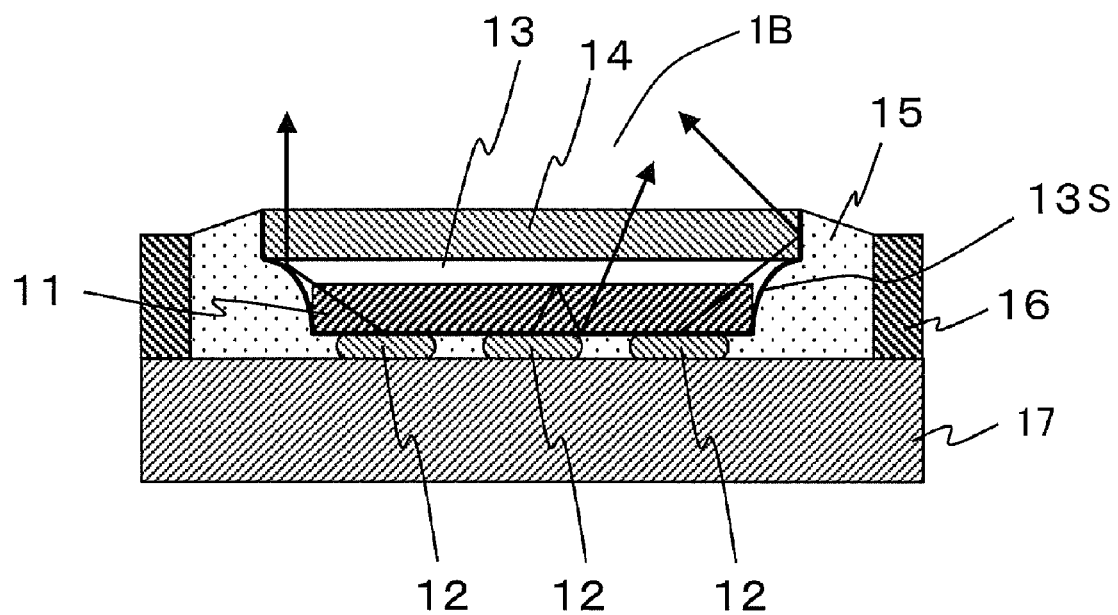
FIG. 14 is an enlarged side cross-sectional view showing another conventional semiconductor light-emitting device having a small light-emitting surface.

In the above-described embodiments of the transparent material layer, cases where each of the side surfaces of the transparent material layers is provided with various inclined shapes, are described. Each of the whole side surfaces of the transparent material layers cannot be necessarily provided with at least one of the inclined surfaces, but each of parts of the side surfaces can be provided with at least one of the inclined surfaces. FIG. 11 is an enlarged top view showing an exemplary common variation of the semiconductor light-emitting devices of the second embodiment and the first embodiment shown in FIG. 9 and FIG. 1, and FIG. 12 is a cross-sectional view taken along lines AC and CB of the semiconductor light-emitting device shown in FIG. 11.

The semiconductor light-emitting device 800 can include a transparent material layer 840 having a first side surface 841A and a second side surface 841B, which is located over the top surface 20a of the semiconductor light-emitting chips 20. The semiconductor light-emitting chips 20, which align in a straight line, can be covered with the wavelength converting layer 30 including the surrounding portion 31 described above, and the transparent material layer 840 can be mounted on the wavelength converting layer 30. Accordingly, the transparent material layer 840 can be formed in a slender shape along the semiconductor light-emitting chips 20.

The first side surface 841A can extend in a locating direction of the semiconductor light-emitting chips 20 and can include two surfaces in parallel with each other. The second side surface 841B including two surfaces can extend in a direction substantially perpendicular to the first side surface 841A as shown in FIG. 11. One of the two surfaces of the first side surface 841A of the transparent material layer 840 can incline in a direction toward the semiconductor light-emitting chips 20 from a bottom surface 840b toward a top surface 840a of the transparent material layer 840, and the second side surface 841B can extend in a direction substantially perpendicular to the bottom surface 840b so as to connect between the top surface 840a and the bottom surface 840b, as shown in FIG. 12.

Accordingly, an area of the top surface 840a, which is a light-emitting surface of the device 800, can be smaller than that of the bottom surface 840b of the transparent material layer 840. Each of the first side surface 841A and the second side surface 841B can be formed in a substantially planar shape, and also can be formed in a convex shape, a concave shape and the like as shown in FIG. 5 to FIG. 8.

The semiconductor light-emitting device 800 including the semiconductor light-emitting chips 20, which align in a straight line, can be widely used as a light source for a vehicle headlight, for example, which is disclosed in Patent Document No. 5 and No. 6. In these cases, when clear cut-off characteristics are required in a vertical direction with reference to a road, the second side surface 841B, which is substantially perpendicular to the locating direction of the semiconductor light-emitting chips 20 can be useful to form the clear cut-off characteristics in the vertical direction with reference to a road.

As described above, the disclosed subject matter can form a light-emitting surface in a small shape such that is slightly larger than the top surface 20a of the semiconductor light-emitting chip 20 via the wavelength converting layer 30 including the surrounding portion 31, which can surround the side surface 20c of the semiconductor light-emitting chip 20, and can improve a light-emitting efficiency and a color variation by using the surrounding portion 31 including the side slant surface 30c contacting with the reflective material layer 60 as a reflector for the light-emitting chip 20. In addition, even when a plurality of light-emitting chips 20 is mounted on the mounting surface 10a of the substrate 10, the light-emitting device can improve a light-emitting efficiency by efficiently using the light emitted from the side surface 20c of the semiconductor light-emitting chips 20, and therefore can various colored lights having a very high light-emitting intensity. Thus, the disclosed subject matter can provide a semiconductor light-emitting device having a high light-emitting efficiency and a small light-emitting surface, which can be used for lighting units such as a vehicle headlight that controls light emitted from the light-emitting device using a reflector and/or a projector lens.

Moreover, the light-emitting surface (the top surface 40a) of the transparent material layer 40 can reduce from the bottom surface 40b toward the top surface 40a of the transparent material layer 40 by inclining the side surface 40c of the transparent material layer 40, which can contact with the reflective material layer 60. Thus, the method of the disclosed subject matter can provide a semiconductor light-emitting device, which can easily various light distributions by forming the side surface 40c of the transparent material layer 40 in various shapes, for example, a focused light from the small light-emitting surface, light having a clear cut-off line for a headlight, etc.

Furthermore, the above-described embodiments are mainly described as a light source device for a vehicle headlight. However, the semiconductor light-emitting device can incorporate various colored lights by combining the above-described semiconductor chip 20 with the wavelength converting layer 30 including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, the multiple chip embodiment could include the surrounding portion 31 including the side surface 30c that are concave. In addition, it is contemplated that any different color chip or different wavelength material can be used in any of the disclosed embodiments and in any combination.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
   a substrate having a mounting surface and conductor patterns formed on the mounting surface;
   a semiconductor light-emitting chip having a top surface, a bottom surface, a side surface and at least one bottom chip electrode located on the bottom surface, and mounted on the mounting surface of the substrate via solder bumps, and the bottom chip electrode electrically connected to at least one of the conductor patterns of the substrate via at least one of the solder bumps;
   a transparent material layer having a top surface, a bottom surface and a side surface being formed in a tabular shape, located over the top surface of the semiconductor light-emitting chip, and the bottom surface of the transparent material layer being larger than the top surface of the semiconductor light-emitting chip;

a wavelength converting layer having a top surface and a side surface disposed between the bottom surface of the transparent material layer and the side surface of the semiconductor light-emitting chip, contacting with the bottom surface of the transparent material layer and the side surface of the semiconductor light-emitting chip, and therefore including a surrounding portion to surround the side surface of the semiconductor light-emitting chip with the wavelength converting layer, and the side surface of the wavelength converting layer extending from the side surface of the semiconductor light-emitting chip toward the bottom surface of the transparent material layer;

a frame located adjacent the mounting surface of the substrate, and surrounding the wavelength converting layer and the transparent material layer; and a reflective material layer having a top surface disposed between the frame and the side surfaces of the wavelength converting layer and the transparent material layer and between the bottom surface of the semiconductor light-emitting chip and the mounting surface of the substrate while surrounding the solder bumps, wherein an area of the top surface of the transparent material layer is smaller than that of the top surface of the wavelength converting layer, and the side surface of the transparent material layer is formed in a substantially inclined planar shape from the bottom surface of the transparent material layer toward the top surface of the transparent material layer, and thereby the area of the top surface of the transparent material layer becomes smaller than that of the top surface of the wavelength converting layer.

2. The semiconductor light-emitting device according to claim 1, wherein the top surface of the reflective material layer becomes higher from the frame toward the transparent material layer with reference to the mounting surface of the substrate.

3. The semiconductor light-emitting device according to claim 1, wherein the side surface of the transparent material layer includes a first side surface and a second side surface extending in a direction substantially perpendicular to the bottom surface of the transparent material layer from the bottom surface of the transparent material layer, the first side surface connects between the second side surface and the top surface of the transparent material layer, and inclines from the second side surface toward the top surface of the transparent material layer, and thereby the area of the top surface of the transparent material layer becomes smaller than that of the top surface of the wavelength converting layer.

4. The semiconductor light-emitting device according to claim 1, wherein the side surface of the transparent material layer is formed in a concave shape toward the semiconductor light-emitting chip, and thereby the area of the top surface of the transparent material layer becomes smaller than that of the top surface of the wavelength converting layer.

5. The semiconductor light-emitting device according to claim 1, wherein the side surface of the transparent material layer is formed in a convex shape toward the reflective material layer, and thereby the area of the top surface of the transparent material layer becomes smaller than that of the top surface of the wavelength converting layer.

6. The semiconductor light-emitting device according to claim 1, wherein the side surface of the transparent material layer includes a first side surface and a second side surface extending in a direction substantially perpendicular to the bottom surface of the transparent material layer from the top surface of the transparent material layer, the first side surface connects between the second side surface and the bottom surface of the transparent material layer, and inclines from the bottom surface of the transparent material layer toward the second side surface, and thereby the area of the top surface of the transparent material layer becomes smaller than that of the top surface of the wavelength converting layer.

7. The semiconductor light-emitting device according to claim 1, wherein the side surface of the transparent material layer is composed of a first side surface and a second side surface extending in a direction substantially perpendicular to the bottom surface of the transparent material layer from the top surface of the transparent material layer to the bottom surface of the transparent material layer, the first side surface connects the second side surface on the side surface of the transparent material layer, and inclines from the bottom surface of the transparent material layer to the top surface of the transparent material layer, and thereby the area of the top surface of the transparent material layer becomes smaller than that of the top surface of the wavelength converting layer.

8. The semiconductor light-emitting device according to claim 3, wherein each of the first side surface and the second side surface of the transparent material layer is formed in a substantially planar shape.

9. A semiconductor light-emitting device comprising:

a substrate having a mounting surface and conductor patterns formed on the mounting surface;

a semiconductor light-emitting chip having a top surface, a bottom surface, a side surface and at least one bottom chip electrode located on the bottom surface, and the semiconductor light-emitting chip mounted on the mounting surface of the substrate via solder bumps, the bottom chip electrode electrically connected to at least one of the conductor patterns of the substrate via at least one of the solder bumps, and the top surface formed in a substantially square shape;

a transparent material layer having a top surface, a bottom surface and a side surface being formed in a tabular shape, and located over the top surface of the semiconductor light-emitting chip, and the bottom surface of the transparent material layer being larger than the top surface of the semiconductor light-emitting chip;

a wavelength converting layer having a top surface and a side surface disposed between the bottom surface of the transparent material layer and the side surface of the semiconductor light-emitting chip, contacting with the bottom surface of the transparent material layer and the side surface of the semiconductor light-emitting chip, and therefore including a surrounding portion to surround the side surface of the semiconductor light-emitting chip with the wavelength converting layer, and the side surface of the wavelength converting layer extending from the side surface of the semiconductor light-emitting chip toward the bottom surface of the transparent material layer;

a frame located adjacent the mounting surface of the substrate, and surrounding the wavelength converting layer and the transparent material layer; and a reflective material layer having a top surface disposed between the frame and the side surfaces of the wavelength converting layer and the transparent material layer and between the bottom surface of the semiconductor light-emitting chip and the mounting surface of the substrate while surrounding the solder bumps, wherein an area of the top surface of the transparent material layer is smaller than that of the top surface of the wavelength converting layer, and the side surface of the transparent material layer is formed in a substantially inclined planar shape from the bottom surface of the transparent material layer toward the top surface of the transparent material layer, and thereby the area of the top surface of the transparent material layer becomes smaller than that of the top surface of the wavelength converting layer.

10. The semiconductor light-emitting device according to claim 9, wherein the top surface of the reflective material layer becomes higher from the frame toward the transparent material layer with reference to the mounting surface of the substrate.

11. The semiconductor light-emitting device according to claim 9, wherein the side surface of the transparent material layer includes a first side surface and a second side surface extending in a direction substantially perpendicular to the bottom surface of the transparent material layer from the bottom surface of the transparent material layer, the first side surface connects between the second side surface and the top surface of the transparent material layer, and inclines from the second side surface toward the top surface of the transparent material layer, and thereby the area of the top surface of the transparent material layer becomes smaller than that of the top surface of the wavelength converting layer.

12. The semiconductor light-emitting device according to claim 9, wherein the side surface of the transparent material layer is formed in a concave shape toward the semiconductor light-emitting chip, and thereby the area of the top surface of the transparent material layer becomes smaller than that of the top surface of the wavelength converting layer.

13. The semiconductor light-emitting device according to claim 9, wherein the side surface of the transparent material layer is formed in a convex shape toward the reflective material layer, and thereby the area of the top surface of the transparent material layer becomes smaller than that of the top surface of the wavelength converting layer.

14. A semiconductor light-emitting device comprising:
a substrate having a mounting surface and conductor patterns formed on the mounting surface;
a plurality of semiconductor light-emitting chips each having a bottom surface and at least one bottom chip electrode located on the bottom surface, including a top surface and a side surface, and mounted on the mounting surface of the substrate via solder bumps, and the bottom chip electrode electrically connected to at least one of the conductor patterns of the substrate via at least one of the solder bump;
a transparent material layer having a top surface, a bottom surface and a side surface being located over the top surface of the semiconductor light-emitting chips, and the bottom surface of the transparent material layer being larger than the top surface of the semiconductor light-emitting chips;
a wavelength converting layer having a top surface and a side surface disposed between the bottom surface of the transparent material layer and at least the side surface of the semiconductor light-emitting chips, contacting with the bottom surface of the transparent material layer and the side surface of the semiconductor light-emitting chips, and therefore including a surrounding portion to surround the side surface of the semiconductor light-emitting chips with the wavelength converting layer, and the side surface of the wavelength converting layer extending from the side surface of the semiconductor light-emitting chips toward the bottom surface of the transparent material layer;
a frame located adjacent the mounting surface of the substrate, and surrounding the wavelength converting layer chip and the transparent material layer; and
a reflective material layer having a top surface disposed between the frame and the side surfaces of the wavelength converting layer and the transparent material layer and between each of the bottom surfaces of the semiconductor light-emitting chips and the mounting surface of the substrate while surrounding the solder bumps, wherein an area of the top surface of the transparent material layer is smaller than that of the top surface of the wavelength converting layer, and the side surface of the transparent material layer is formed in a substantially inclined planar shape from the bottom surface of the transparent material layer toward the top surface of the transparent material layer, and thereby the area of the top surface of the transparent material layer becomes smaller than that of the top surface of the wavelength converting layer.

15. The semiconductor light-emitting device according to claim 14, wherein the top surface of the reflective material layer becomes higher from the frame toward the transparent material layer with reference to the mounting surface of the substrate.

16. The semiconductor light-emitting device according to claim 14, wherein the side surface of the transparent material layer includes a first side surface and a second side surface extending in a direction substantially perpendicular to the bottom surface of the transparent material layer from the bottom surface of the transparent material layer, the first side surface connects between the second side surface and the top surface of the transparent material layer, and inclines from the second side surface toward the top surface of the transparent material layer, and thereby the area of the top surface of the transparent material layer becomes smaller than that of the top surface of the wavelength converting layer.

17. The semiconductor light-emitting device according to claim 14, wherein the side surface of the transparent material layer is formed in a concave shape toward the semiconductor light-emitting chips, and thereby the area of the top surface of the transparent material layer becomes smaller than that of the top surface of the wavelength converting layer.

18. The semiconductor light-emitting device according to claim 14, wherein the side surface of the transparent material layer is formed in a convex shape toward the reflective material layer, and thereby the area of the top surface of the transparent material layer becomes smaller than that of the top surface of the wavelength converting layer.

19. The semiconductor light-emitting device according to claim 14, wherein the top surface of the plurality of semiconductor light-emitting chips is formed in a substantially square shape, and the side surface of the transparent material layer extends along the side surface of the plurality of semiconductor light-emitting chips.

20. A semiconductor light-emitting device comprising:
a substrate having a mounting surface and conductor patterns formed on the mounting surface;
a plurality of semiconductor light-emitting chips each having a bottom surface and at least one bottom chip electrode located on the bottom surface, including a top surface and a side surface, and mounted on the mounting surface of the substrate via solder bumps, and the bottom chip electrode electrically connected to at least one of the conductor patterns of the substrate via at least one of the solder bump;

a transparent material layer having a top surface, a bottom surface and a side surface being located over the top surface of the semiconductor light-emitting, the bottom surface of the transparent material layer being larger than the top surface of the semiconductor light-emitting chips, the side surface of the transparent material layer including a first side surface and a second side surface, each of the first side surface and the second side surface of the transparent material layer including two surfaces facing with respect to each other, each of the two surfaces of the first side surface connecting between the two surfaces of the second side surface, and one of the two surfaces of the first surface extending between the top surface and the bottom surface of the transparent material layer at a substantially right angle with respect to the bottom surface of the transparent material layer;

a wavelength converting layer having a top surface and a side surface disposed between the bottom surface of the transparent material layer and at least the side surface of the semiconductor light-emitting chips, contacting with the bottom surface of the transparent material layer and the side surface of the semiconductor light-emitting chips, and therefore including a surrounding portion to surround the side surface of the semiconductor light-emitting chips with the wavelength converting layer, and the side surface of the wavelength converting layer extending from the side surface of the semiconductor light-emitting chips toward the bottom surface of the transparent material layer;

a frame located adjacent the mounting surface of the substrate, and surrounding the wavelength converting layer chip and the transparent material layer; and a reflective material layer disposed between the frame and the side surfaces of the wavelength converting layer and the transparent material layer and between each of the bottom surfaces of the semiconductor light-emitting chips and the mounting surface of the substrate while surrounding the solder bumps, wherein an area of the top surface of the transparent material layer is smaller than that of the top surface of the wavelength converting layer, and another of the two surface of the first side surface of the transparent material layer is formed in a substantially inclined planar shape from the bottom surface of the transparent material layer toward the top surface of the transparent material layer, and thereby the area of the top surface of the transparent material layer becomes smaller than that of the top surface of the wavelength converting layer.

* * * * *